US007005484B1

(12) United States Patent
Holmes et al.

(10) Patent No.: US 7,005,484 B1
(45) Date of Patent: Feb. 28, 2006

(54) POLYMERIZATION METHOD

(75) Inventors: Andrew B. Holmes, Cambridge (GB); Florence D. Geneste, Noyal sur Vilaine (FR); Rainer E. Martin, Grenzach/Wyhlen (DE); Franco Cacialli, Cambridge (GB)

(73) Assignee: Cambridge Display Technology Limited, Cambridge (GB)

( * ) Notice: Subject to any disclaimer, the term of this patent is extended or adjusted under 35 U.S.C. 154(b) by 357 days.

(21) Appl. No.: 10/048,097

(22) PCT Filed: Jul. 24, 2000

(86) PCT No.: PCT/GB00/02850

§ 371 (c)(1),
(2), (4) Date: Jun. 4, 2002

(87) PCT Pub. No.: WO01/07502

PCT Pub. Date: Feb. 1, 2001

(30) Foreign Application Priority Data

Jul. 24, 1999 (GB) ..................................... 9917356

(51) Int. Cl.
*C08G 61/00* (2006.01)
*H05B 33/14* (2006.01)
*C09K 11/06* (2006.01)

(52) U.S. Cl. ........................ 526/75; 526/173; 526/239; 526/240; 526/242; 526/279; 526/280; 526/293; 526/294; 526/296; 526/301; 528/40; 528/43; 528/367; 528/369; 528/394; 528/397; 257/40; 428/690; 428/917; 313/504

(58) Field of Classification Search .................. 526/75, 526/173, 239, 240, 242, 279, 280, 293, 294, 526/296, 301; 528/40, 43, 367, 369, 394, 528/397; 257/40; 428/690, 917; 313/504
See application file for complete search history.

(56) References Cited

U.S. PATENT DOCUMENTS 6,114,490 A * 9/2000 Kreuder et al. ................ 528/86

FOREIGN PATENT DOCUMENTS

| JP | 09-104732 | | 4/1997 |
| WO | WO 96/29356 | * | 9/1996 |
| WO | WO 98/46652 | | 10/1998 |

OTHER PUBLICATIONS

McCullough et al., "Enhanced Electrical Conductivity in Regioselectively Synthesized Poly(3-alkylthiophenes)", J. Chem. Soc., Chem. Commun., 1992, pp. 70-72.*
"Directed Ortho Metalation", Victor Snieckus, Chemical Reviews, vol. 90, No. 6, Sep./Oct. 1990, pp. 879-933.
"Combined Directed Ortho Metalation-Cross Coupling Strategies", Victor Snieckus, Pure & Appl. Chem, vol. 66, Nos 10/11, 1994, pp. 2155-2158.
"Photoluminescence and Electroluminescence of Films From Soluble PPV-Polymers", Andersson et al., Elsevier Science, Synthetic Metals 85, 1997, pp. 1275-1276.
"Electroluminescent Properties of Novel Silyl-Disubstituted Soluble PPV Derivative", Hwang et al., Mol. Cryst. Liq. Cryst., vol. 316, 1998, pp. 281-284.
"*Synthesis of 2-Substituted Dihydropyran* 3-0-Carbamates via Combined Metalation—Suzuki—Miyaura Cross-Coupling Reactions", Bower et al., J. Org. Chem, 63, 1998, pp. 1514-1518.
"Synthesis, Spectroscopy and Electrochemistry Study on a Novel Di-Silyl Substituted Poly(p-phenylenevinylene)", Wang et al., Elsevier Science, Synthetic Metals 105, 1999, pp. 85-89.
International Search Report for PCT/GB00/02850 dated Jan. 23, 2001.
International Preliminary Examination Report for PCT/GB00/02850 dated Oct. 4, 2001.

* cited by examiner

*Primary Examiner*—Marie Yamnitzky
(74) *Attorney, Agent, or Firm*—Marshall, Gerstein & Borun LLP

(57) ABSTRACT

A method for making a polymer or oligomer comprising the steps of making a first monomer comprising a substituted aromatic or heteroaromatic group by providing an aromatic or heteroaromatic group substituted with first and second director groups, performing metalisation at a first position on the aromatic or heteroaromatic group, performing electrophilic substitution so as to provide a first substituent group at the first position, and contacting in a reaction mixture the first monomer with at least two further monomers that independently are the same or different from the first monomer under conditions so as to form a polymer or oligomer, wherein the nature and positions of the first and second director groups regioselect the first position.

20 Claims, 6 Drawing Sheets

POLYMERIZATION METHOD

This is the U.S. national phase of International Application No. PCT/GB00/02850 filed Jul. 24, 2000, the entire disclosure of which is incorporated herein by reference.

The present invention relates to a method for making a polymer or oligomer and to polymers or oligomers preparable by or prepared by the method. Use of the polymers or oligomers also is provided.

More specifically, the present invention is directed to conjugated molecules, oligomers and polymers for use in electric, electronic, optical and optoelectronic devices, e.g. small molecule and polymer based light emitting devices such as light emitting diodes (LEDs). In particular, the present invention concerns a process for the synthesis of aromatic precursors which when coupled together in controlled C—C bond forming processes afford luminescent, conjugated molecules, oligomers, macromolecules and polymers.

High photoluminescence efficiency in the solid state is a prerequisite for organic semiconductors capable of light emission through charge injection under an applied field (electroluminescence). Processes which deliver aromatic precursor molecules suitably disposed for participation in polymerisation coupling reactions are advantageous in the design of new conjugated systems for applications in luminescent devices. Much evidence is developing that variation of substitution patterns can afford improved efficiencies in photoluminescence.

There exist several known procedures for coupling aromatic monomers to afford conjugated polymers or oligomers, particularly for use in luminescent devices. One such method is Gilch dehydrohalogenation polycondensation of 1,4-bis(halomethyl) aromatic derivatives. This method is described in documents such as Gilch, et al. *J Poly Sci.* 1-A, 1966, 4, 1337; Wudl, U.S. Pat. No. 5,189,136/1990; H. Spreitzer, W. Kreuder, H. Becker, and H. Schoo WO 98/27136; H. Becker, H. Spreitzer, K. Ibrom and W. Kreuder, *Macromolecules,* 1999, 32, 4925–4932. The Gilch dehydrohalogenation method depends in particular on either radical bromination of the corresponding dimethyl derivative or halomethylation of a reactive precursor. The former suffers from low yields owing to electrophilic halogenation of the aromatic ring. This occurs particularly when there are further substituents on the aromatic ring that are activating groups for electrophilic substitution. The latter requires electron rich aromatic precursors for good yields in the halomethylation. The halomethylation reaction is particularly unattractive for large scale manufacturing owing to the likely formation during the process of methyl halomethyl ether (where the halo is Cl or Br) which is a potent carcinogen.

A further known polymerisation reaction is Suzuki (Pd catalysed) cross coupling of boronic acid derivatives with vinyl and aryl halides as described in Schlüter and Wegner, *Acta Polyym.,* 1993, 44, 59. This reaction often is referred to as "Suzuki" polymerisation.

Another known polymerisation reaction is Horner Wittig polycondensation of bis(phosphonates) with dicarbonyl compounds. This method is discussed in Kreuder et al. WO 96/10617 (1996); *Chem. Abstr.,* 1996, 124, 345038u.

Yamamoto, *Progr. Polym. Sci.,* 1992, 17, 1153 discloses a still further polymerisation reaction involving nickel-catalysed cross coupling of aromatic dibromo-derivatives. This reaction often is referred to as "Yamamoto" polymerisation.

Polymerisation by McMurry coupling of dicarbonyl derivatives is described in Feast, et al., Abstracts of Papers of the American Chemical Society, 1998, Vol. 215 (Pt2), pp. 322-POLY; and Daik et al., *New J Chem.,* 1998, 22, 1047.

The synthesis of certain monomers for use in the above polymerisation reactions will be recognised as problematic by those skilled in this art. This has the consequence that the range of polymers obtainable by these polymerisation reactions is limited.

Poly(p-arylene vinylenes) (PPVs) are generally described in WO98/27136.

A silyl-disubstituted PPV derivative is disclosed in Synthetic Metals, 101, (1999) 216–217. The two silyl substituent groups are the same. The poly[2,5-bis(dimethyloctyl silyl)-1,4-phenylene-vinylene] polymer was synthesised from 2,5-bis(bromomethyl)-1,4-bis(dimethyloctyl silyl) benzene through a dehydrohalogenation polycondensation reaction.

Outside the field of polymerisation, the concept of directed metalation of bis-carbamates and urethanes has been reported, for example in Snieckus Pure Appl. Chem., 1994, 66, 2155; Bower et al. *J. Org Chem.,* 1998, 63, 1514; and V. Snieckus, *Chem. Rev.,* 1990, 90, 879–933. However, this concept has not been disclosed or suggested as a step in a method for making a polymer or oligomer.

The present inventors have identified a need to provide an improved method for providing monomers for use in the above-mentioned polymerisation reactions.

Accordingly, it is an aim of the present invention to provide an improved method for making a polymer or oligomer.

It is a further aim of the present invention to provide polymers and oligomers prepared by and preparable by the improved method.

It is a further aim of the present invention to provide an optical device or component therefor comprising the polymers and oligomers which are the subject of the present invention.

It is a further aim of the present invention to provide a use for the polymers which are the subject of this invention.

Finally, it is a further aim of the present invention to provide a method for making an optical device or component therefor using the polymers which are the subject of the present invention.

Accordingly, in a first aspect of the present invention there is provided a method for making a polymer or oligomer comprising the steps of: (a) making a first monomer comprising a substituted aromatic or heteroaromatic group by: (i) providing an aromatic or heteroaromatic group substituted with first and second director groups; (ii) performing metalation at a first position on the aromatic or heteroaromatic group; (iii) performing electrophilic substitution so as to provide a first substituent group at the first position; and (b) contacting in a reaction mixture the first monomer with at least two further monomers that independently are the same or different from the first monomer under conditions so as to form a polymer or oligomer; wherein the nature and positions of the first and second director groups regioselect the first position.

In a second aspect of the present invention there is further provided a, preferably soluble, polymer or oligomer prepared in accordance with the method defined in the first aspect.

In a third aspect of the present invention there is still further provided a, preferably soluble, polymer or oligomer preparable in accordance with the method defined in the first aspect, having a repeat unit comprising an aromatic or heteroaromatic group with first and second linked positions and first and second director groups X and Y where X is ortho to the first linked position and Y is ortho to the second linked position group and X and Y are the same or different and independently comprise a hydroxyl, alkoxy, alkoxyalkyl, amide, halide, haloalkyl, amino, aminoalkyl, carboxylic acid ester, urethane, carbamate, sulphonamide, sulphurylalkyl, or carbamide group; and A is C, O, S or NR and n=0; or A is C or NR, B is C or NR, n=1 and R is a pendant group, preferably hydrocarbyl, optionally containing one or more heteroatoms.

In a fourth aspect of the present invention there is still further provided a, preferably soluble, polymer or oligomer preparable in accordance with the method defined in the first aspect having a repeat unit comprising a substituted or unsubstituted vinylene group and an aromatic or heteroaromatic group having first and second silyl substituent groups X' and Y' that are different from each other where X' is ortho to a first linked position and Y' is ortho to the vinylene group.

In a fifth aspect of the present invention there is still further provided an optical device or component therefor comprising: a first charge carrier injecting layer for injecting positive charge carriers (an anode); a second charge carrier injecting layer for injecting negative charge carriers (a cathode); a light-emissive layer located between the charge carrier injecting layers for accepting and combining positive and negative charge carriers to generate light; wherein the light-emissive layer comprises a polymer or oligomer as defined in any one of the second, third or fourth aspects of the present invention.

In a sixth aspect of the present invention there is still further provided use of a polymer or oligomer as defined in any one of the second, third or fourth aspects of the present invention in an optical device.

In a seventh aspect of the present invention there is still further provided a method for making an optical device or component therefor comprising the steps of: (a) providing a polymer or oligomer as defined in the second, third or fourth aspects of the present invention; and (b) including the polymer or oligomer in an optical device or component therefor.

In the first aspect, the present invention provides an efficient method of synthesis for a monomer comprising a substituted aromatic or heteroaromatic group for polymerising to form a polymer or oligomer. One advantage of the present method is the ability to control the substituents, which can be introduced sequentially, and therefore can be different from one another.

For the purposes of the present invention, the term "oligomers" is intended to encompass trimers, tetramers and higher order oligomers up to 5. The term "polymers" is intended to encompass all materials having a degree of polymerisation greater than an oligomer.

Also, for the purposes of the present invention, the phrase "aromatic or heteroaromatic group" is intended to encompass mononuclear aromatic groups and polynuclear aromatic groups. A mononuclear aromatic group has only one aromatic ring, for example phenyl or phenylene. A polynuclear aromatic group has two or more aromatic rings which may be fused (for example naphthalene, quinoline or indole), individually covalently linked (for example biphenyl) and/or a combination of both fused and individually covalently linked aromatic rings.

Preferably, the aromatic or heteroaromatic group is substantially conjugated over substantially the whole group. Performing metalation at a first position in step (ii) can be by the replacement of any suitable group, for example hydrogen, or halogen (e.g. Cl, I or Br). However, it is preferred that metalation is performed by the replacement of hydrogen at the first position.

A first substituent group is provided at the first position in step (iii). This first substituent may be provided directly by electrophilic substitution at the first position. Alternatively, the first substituent may be provided by electrophilic substitution followed by one or more additional steps.

This method is particularly suitable for functionalising aromatic or heteroaromatic groups in a manner which is not easily realisable by alternative synthetic strategies. In this regard, an aromatic or heteroaromatic group that is asymmetrically substituted has previously been difficult to prepare. Asymmetric ring substitution of aromatic or heteroaromatic groups, particularly polyarylene vinylenes is expected to disrupt interchain packing. When such groups are included asymmetrically in a polymer or oligomer this leads to increased luminescence efficiencies as discussed in M. R. Andersson G. Yu, and A. J. Heeger, Synth. Met., 1997, 85, 1275.

The polymer DMOS-PPV 6 which is known from D.-H. Hwang, S. T. Kim, H. K. Shim, A. B. Holmes, S. C. Moratti and R. H. Friend, Chem. Commun., 1996, 2241–2242 can be prepared in good yield in accordance with the present method. This can be seen from the reaction scheme shown below:

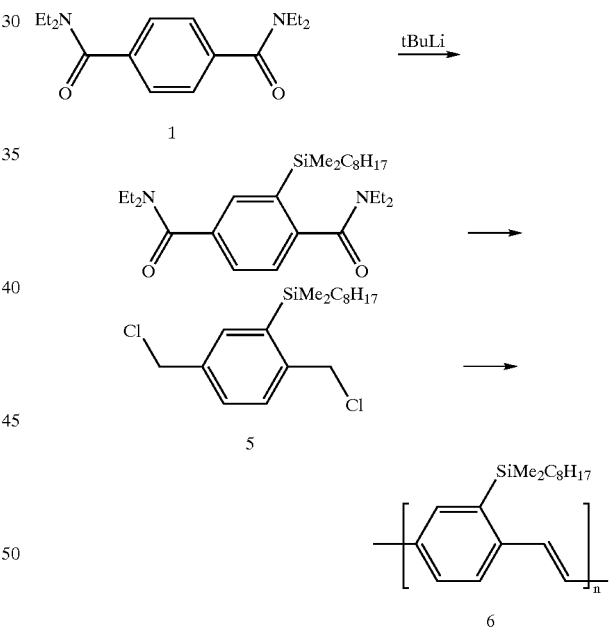

In a second embodiment of the first aspect of the present invention, step (a) further comprises a step (iv) of performing metalation at a second position on the aromatic or heteroaromatic group; and a step (v) of performing electrophilic substitution so as to provide a second substituent group at the second position; wherein the nature and position of the first and second director groups regioselect the second position.

Performing metalation at a second position in step (iv) can be by the replacement of any suitable group, for example hydrogen, or halogen (e.g. Cl, I or Br). However, it is preferred that metalation is performed by the replacement of hydrogen at the first position.

A second substituent group is provided at the second position in step (v). This second substituent may be provided directly by electrophilic substitution at the second position. Alternatively, the second substituent may be provided by electrophilic substitution followed by one or more additional steps.

The first and second substituent group are the same or different. Preferably, the first and second substituent groups are different.

It is preferred that the first and/or second substituent groups in the present method independently are selected from the group consisting of halide, $B(OH)_2$, $B(OR)_2$, alkoxy, alkoxyalkyl, alkyl, hydroxyl, aryl, heteroaryl, $SnR_3$, silyl, amide, and $COCF_3$. Of these groups, it is more preferable that the first and/or second substituent groups independently are selected from the group consisting of Br, I, $SiMe_2C_8H_{17}$, $SiMe_2C_{10}H_{21}$, and $SiMe_3$.

Preferably, the aromatic or heteroaromatic group is asymmetrically substituted.

Referring to the metalation steps of the present method, metalation can be performed by the addition to the reaction mixture of any suitable organo-metal derivative such as an organo lithium derivative or stannane, boronic acid or ester, copper reagent (Cu I), zinc reagent (Zn II), magnesium reagent (Mg II) or nickel reagent (Ni II, Ni 0). However, organo-lithium is preferred and tBuLi is most preferred.

Where metalation is by replacement of hydrogen, it is preferred that metalation is performed by the addition to the reaction mixture of organo lithium derivative, optionally followed by trans metalation using the reagents as outlined above.

Steric and inductive effects of the nature and positions of the first and second director groups must be considered in the present method.

Preferably, the nature and positions of the first and second director groups regioselect the first position to be ortho to the first director group.

Also preferably, the nature and positions of the first and second director groups regioselect the second position to be ortho to the second director group.

Where the nature and positions of the first and second director groups select both the first position to be ortho to the first director group and the second position to be ortho to the second director group, a possible reaction scheme is shown below:

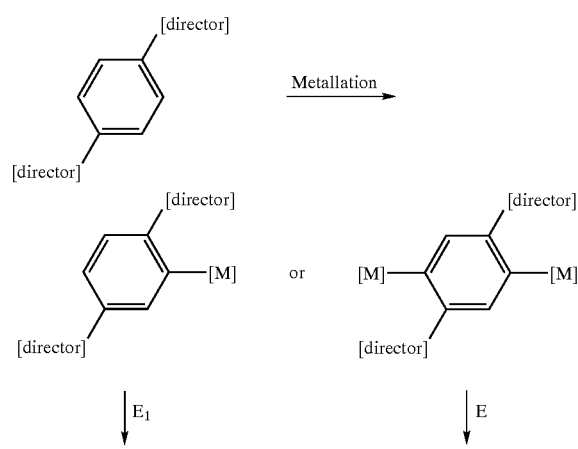

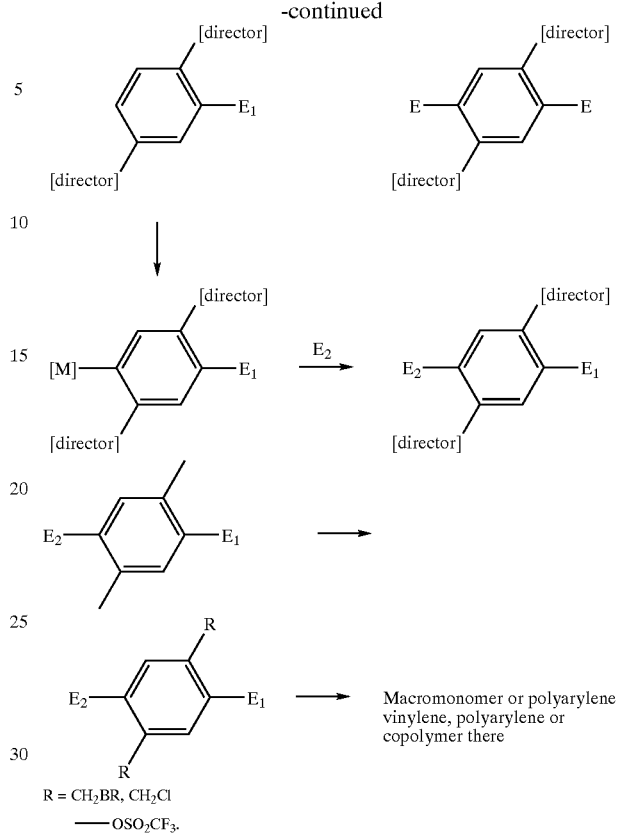

E is, for example, Br, I $B(OH)_2$, $B(OR)_2$, OR, OH, Ar, R, heteroaromatic, $SnR_3$, $SiR_3$, —$SiR_1R_2R_3$, $NR_2$ or $COCF_3$ and R is a pendant group, preferably hydrocarbyl, optionally containing one or more heteroatoms.

Analogous reactions can be envisaged for any heteroaromatic or aromatic starting material suitably functionalised with two "director" groups. Specifically the route could lead conveniently to substituted fluorene derivatives and naphthalene derivatives.

The first and second director groups are the same or different.

Conveniently, the first and second director groups independently are selected from alkoxy, alkoxyalkyl, amide, halide, haloalkyl, amino, aminoalkyl, carboxylic acid ester, urethane, carbamate, sulphonamide, sulphurylalkyl, or carbamide.

In the present method, it is preferable that the first and second director groups independently are selected from the group consisting of $CONEt_2$, $CONHCMe_2Ph$, $OCONMeCMe_2Ph$, $OCONEt_2$ and $SO_2NHCMe_2Ph$ $SO_2$-tBu.

N,N-diethylcarboxamide (—$CONEt_2$) and urethane (e.g. —OCONEt2) director groups can be used to direct metalation, for example, with t-butyl lithium to adjacent (ortho) positions. The resulting organo-lithium can be alkylated, silylated, boronated, or stannylated and converted into a range of organometallic derivatives for new C—C bond formation to the aromatic ring. The resulting metal derivative can be cross coupled with suitable precursors in a polymerisation reaction.

In a third embodiment according to the first aspect of present invention, step (a) further comprises a step (vi) of converting into a reactive group one or both of the director groups and/or one or both of the first and second substituent groups to form a monomer having two reactive groups that are capable of participating in polymerisation.

When one or both of the director groups and/or one or both of the first and second substituent groups can be converted into a reactive group that is capable of participating in one of the cross-coupling polymerisation reactions mentioned above, the present method offers a wide variety of novel substituted monomers for the synthesis of conjugated, luminescent oligomers and polymers.

Conversion in step (vi) can be via one or a number of chemical conversion steps.

Suitably, the two reactive groups are para to one another.

A carboxamide director group can be reduced to a tertiary amine and ultimately converted into $CH_2Cl$ or $CH_2Br$ for Gilch polymerisation. A urethane director group can be cleaved to phenol, converted into triflate and subjected to metal-mediated cross coupling to give poly(arylene)s, poly(arylene-vinylenes) by the Heck reaction (for example) or poly(arylene ethylenes) by Sonogashira polycondensation.

Many aromatic and heteroaromatic precursors could be prepared by the present method. Boronate and halo-substituted precursors for Suzuki cross coupling of substituted fluorene derivatives could be made in processes leading to novel conjugated materials. Stannane precursors are suitable for use in Stille cross-coupling polymerisation. Preferably the present method can be used to prepare bis(halomethyl) precursors for Gilch dehydrohalogenation.

In accordance with the present method, reaction of the metallated, derivative with $CF_3CO_2Et$ would lead to the corresponding mono- or bis trifluoroacetyl-substituted derivatives which through Horner poly condensation can yield novel $CF_3$-substituted poly(arylene vinylene) derivatives.

In specific examples of this third embodiment, each director group independently can be converted to a phosphonate, a carbonyl, a triflate or a halomethyl reactive group. Where each director group independently is converted to a halomethyl group, the first monomer is suitable for use in the Gilch dehydrohalogenation reaction referred to above.

One class of polymer or oligomer which suitably may be prepared in accordance with the second aspect of the present invention includes polymers or oligomers comprising an arylene vinylene repeat unit that is derived from the first monomer. Preferably, the arylene vinylene repeat unit comprises a phenylene vinylene group.

In other specific examples of the above embodiment, each substituent group independently is converted to a halide reactive group. Consequently, the first monomer conveniently can participate in "Yamamoto" polymerisation or "Suzuki" polymerisation as referred to above.

Another class of polymer or oligomer that conveniently can be prepared in accordance with the second aspect of the present invention by the present method is a polymer or oligomer comprising a phenylene repeat unit that is derived from the first monomer.

A polymer or oligomer prepared in accordance with the method described in the first aspect of the present invention is provided in a second aspect of the present invention.

In the third aspect of the present invention, it is preferred that the two linked positions are para to one another. A linked position is a position on the aromatic or heteroaromatic group which is covalently linked (usually by a C—C bond) to a further group in the polymer or oligomer chain.

It is further preferred that the aromatic or heteroaromatic group comprises a group having general formula I:

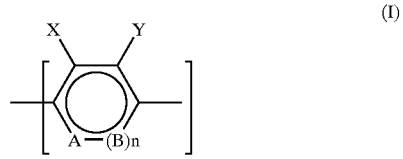

Preferably, a polymer or oligomer in accordance with the third aspect of the present invention, has a repeat unit comprising an aromatic or heteroaromatic group comprising a group having general formula II:

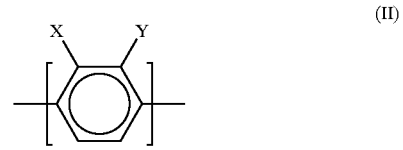

The first and second director groups X and Y in the third aspect of the present invention may be as defined above in relation to the first aspect of the present invention.

It is preferred that an oligomer or polymer in accordance with the third aspect of the present invention is an emissive, preferably luminescent, polymer or oligomer, even more preferably, having a band gap in the range 1.5 eV to 3.5 eV.

Polymers and oligomers of particular interest which are in accordance with the third aspect of the present invention are those shown below:

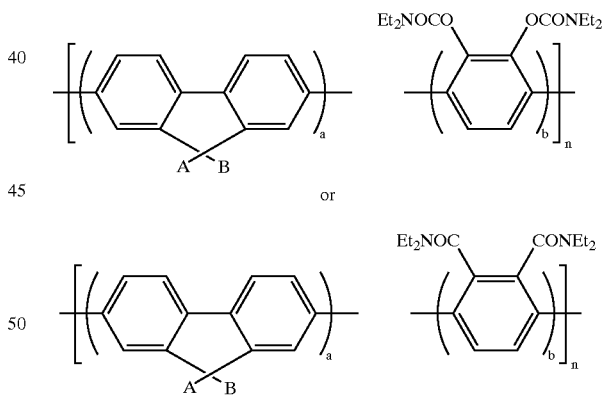

where A and B are the same or different and are each H or alkyl, cyclo-or branched-alkyl; n is in the range from 2 to 100, preferably n is about 6; and 1<a<10, preferably a is 1 and 1<b<10, preferably b is 1.

The C9 substituents A and B on the fluorene comonomers can be selected to improve the solubility of the polymer or oligomer. In this regard, preferred C9 substituents are $C_6H_{13}$ and $C_8H_{17}$.

In the fourth aspect of the present invention, it is preferred that the polymer or oligomer has a repeat unit comprising the group shown in general formula III:

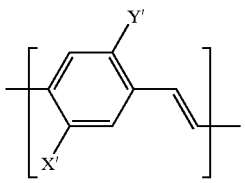

(III)

Also, it is preferred that X' is $SiR_1R_2R_3$ and Y' is $SiR'_1R'_2R'_3$ and $R_1$, $R_2$, $R_3$, $R'_1$, $R'_2$, and $R'_3$ independently is alkyl or cycloalkyl. Even more preferably, X' and Y' each independently is $SiMe_2C_{10}H_{21}$ or $SiMe_2C_8H_{17}$.

A polymer of particular interest in accordance with the fourth aspect of the present invention comprises a homopolymer. The term "homopolymer" may be taken to mean that it has been prepared from a single type of monomer. In this regard, a monomer is distinguished from a repeat unit because a homopolymer could be defined as having more than one different repeat unit.

Preferably, the homopolymer has the formula:

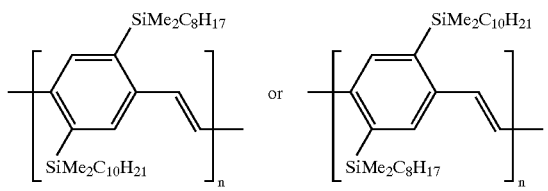

where n is from 4 to 200, preferably 4 to 100.

It is preferred that a polymer or oligomer in accordance with the fourth aspect of the present invention is a luminescent polymer or oligomer. More preferably, the polymer or oligomer has a band gap in the range 1.5 eV to 3.5 eV.

The fifth aspect of the present invention provides an optical device or component therefor comprising a substrate and a polymer that is in accordance with the second, third or fourth aspect of the present invention supported on the substrate.

In this fifth aspect, an optical device or component therefor is provided comprising: an anode; a cathode; optionally one or more charge transport layers; and a light-emissive layer located between the anode and cathode for accepting and combining positive and negative charge carriers to generate light; wherein the light-emissive layer comprises a polymer or oligomer in accordance with any one of the second, third or fourth aspects of the present invention.

Preferably, the cathode material has a suitable workfunction to inject electrons, for example Ca, Al, LiF—Al, or CsF—Al. Also preferably, the anode material has a suitable workfunction to inject protons.

It is preferred that the optical device or component therefor comprises an electroluminescent device.

In the sixth aspect of the present invention, when a polymer or oligomer in accordance with any one of the second, third or fourth aspects of the present invention is used in an optical device, it is preferred that the optical device comprises an electroluminescent device.

The present invention provides also the use of a polymer or oligomer as defined in the second, third or fourth aspect, as a light-emissive material.

The present invention will be described now in further detail with reference to the attached Figures in which.

The reaction scheme set out below exemplifies the conversion step (vi).

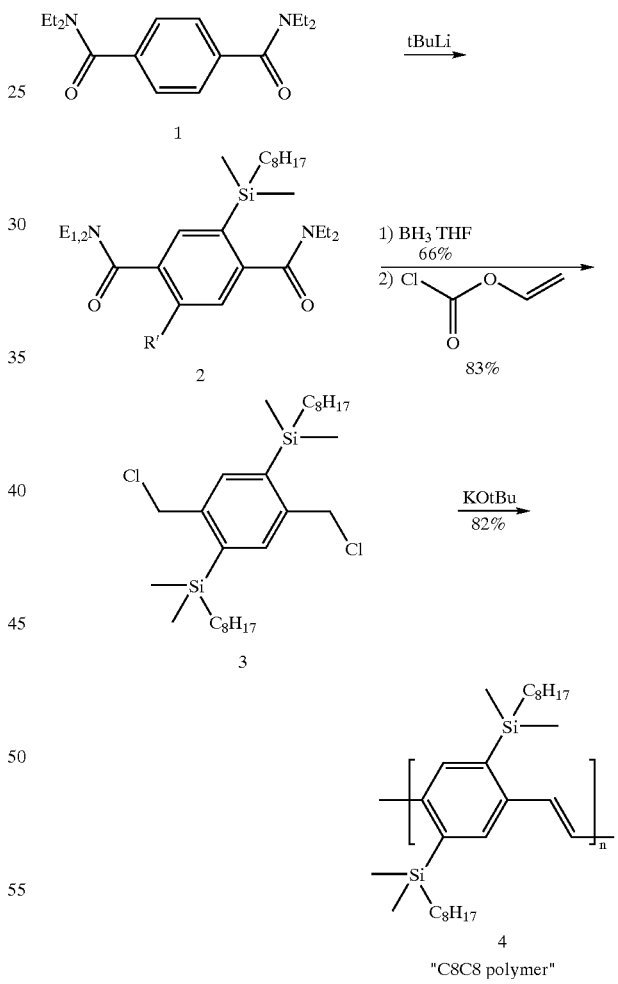

The above scheme illustrates the metalation of the bisamide 1 to yield a bis-metallated derivative and eventually the bis-silylated precursor 2. This has in turn been polymerised to the corresponding conjugated polymer. The example shown yields the poly(2,5-bisdimethyloctylsilyl-1,4-phenylene vinylene)derivative. The advantage with the present method is the high yielding process for the synthesis of a precursor (3) and the avoidance of the carcinogenic chloromethyl methyl ether.

In principle any precursor analogue of 2 containing an aryl or heteroaryl group can be prepared by a C—C coupling reaction.

Figure 1:
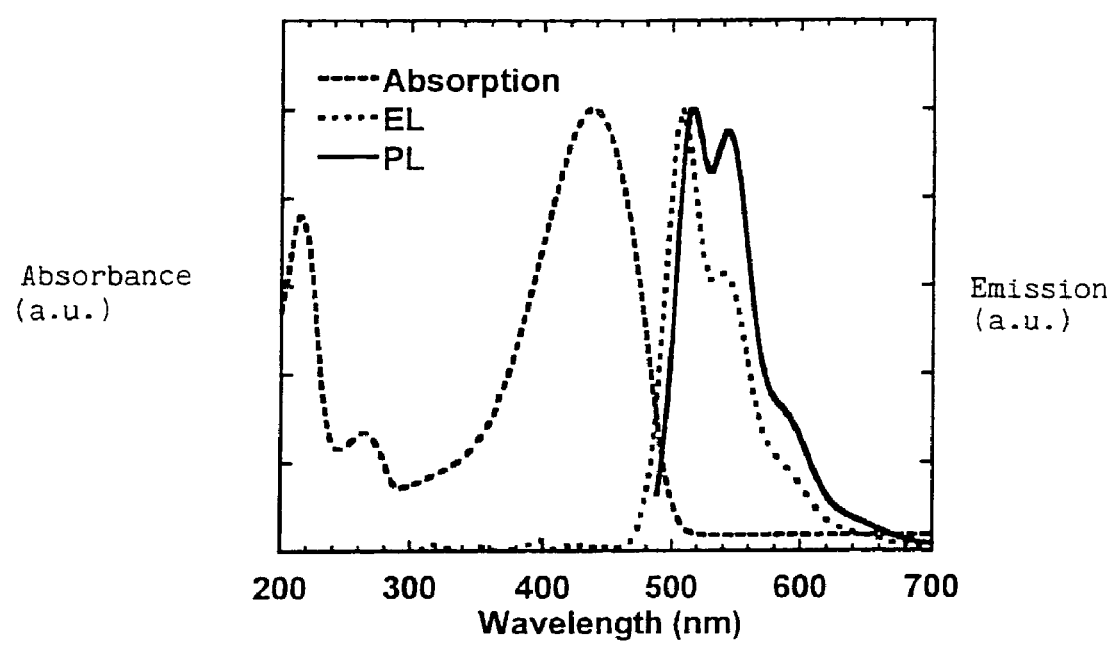
FIG. 1 shows absorption, electroluminescence (EL) and photoluminescence (PL) spectra for the $C_8C_{10}$ polymer where a.u. means arbitrary units.
Figure 2:
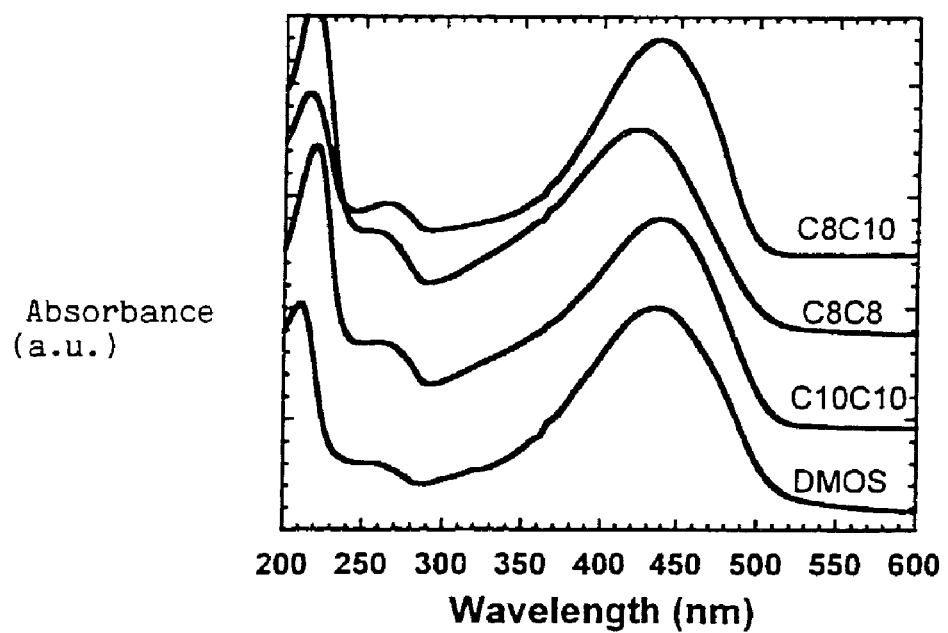
FIG. 2 shows the absorption spectra for each of the $C_8C_{10}$, $C_8C_8$, $C_1C_{10}$ and DMOS-PPV polymers.
Figure 3:
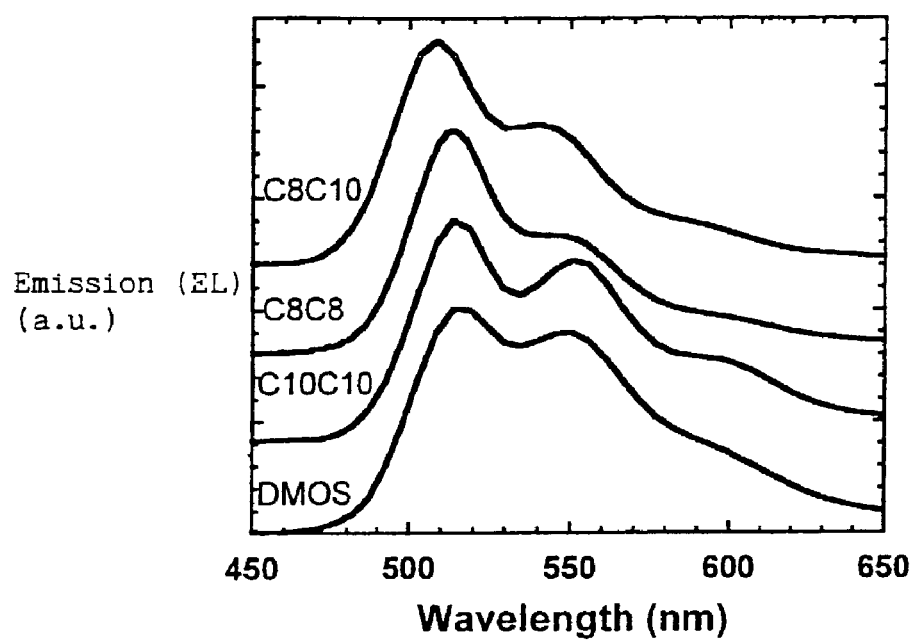
FIG. 3 shows the electroluminescent (EL) spectra for each of the $C_8C_{10}$, $C_8C_8$, $C_{10}C_{10}$ and DMOS-PPV polymers.
Figure 4:
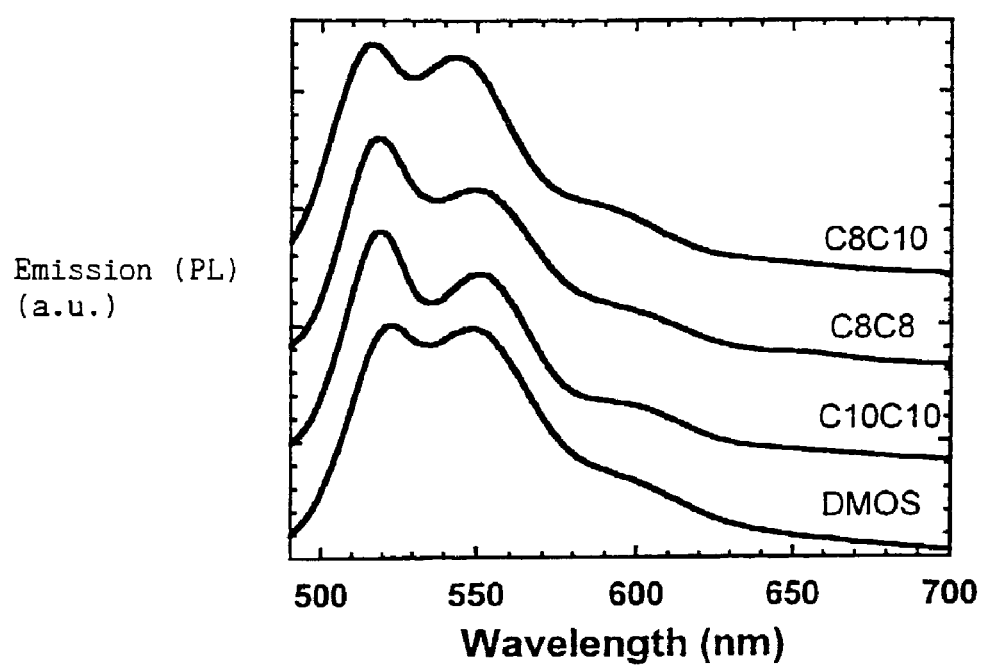
FIG. 4 shows the photoluminescent (PL) spectra for each of the $C_8C_{10}$, $C_9C_8$, $C_{10}C_{10}$ and DMOS-PPV polymers.
Figure 5:
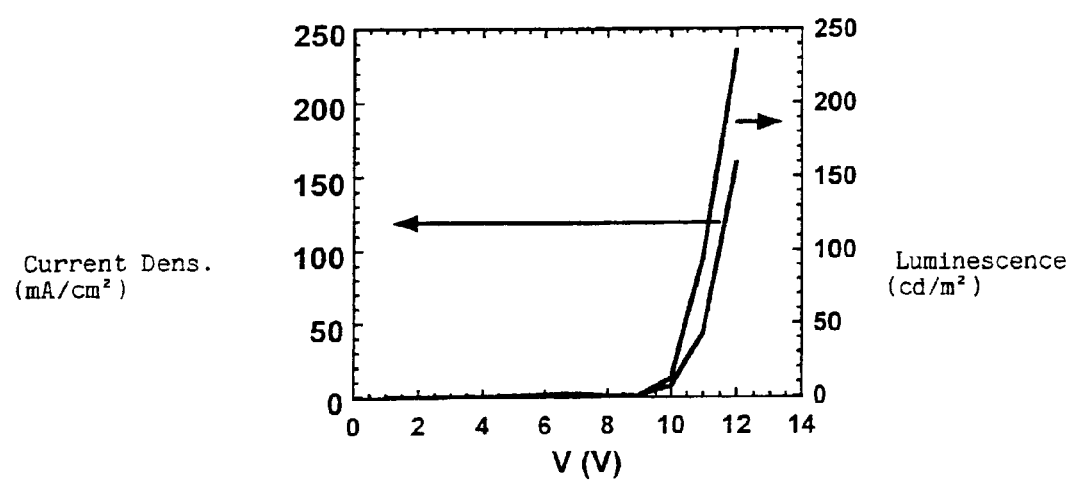
FIG. 5 shows current density and luminescence for a device made from $C_8C_{10}$ polymer with a PEDOT:PSS layer and Al cathode.
Figure 6:
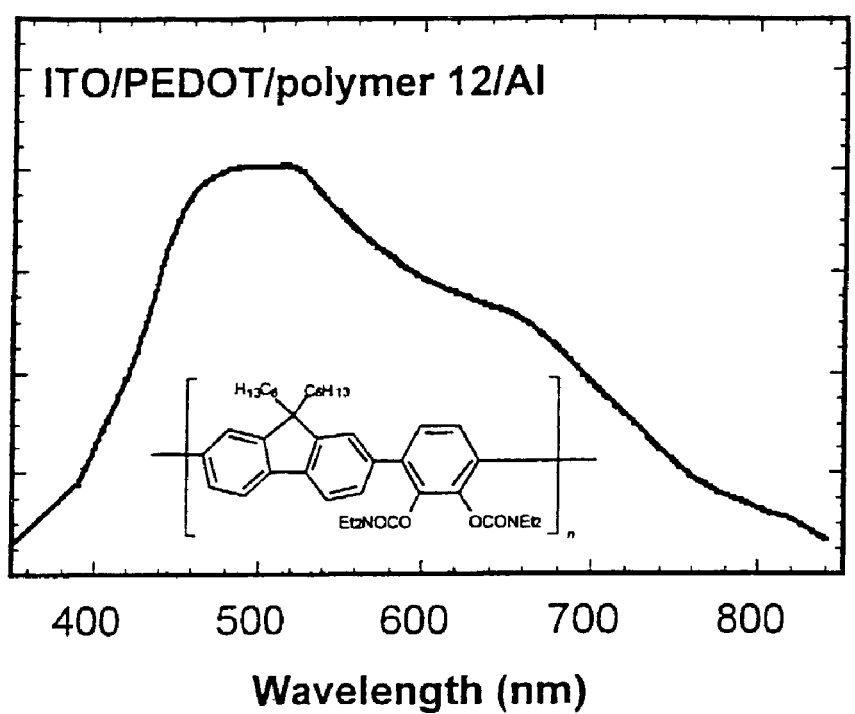
FIG. 6 shows an electroluminescence spectrum of polymer 12, as measured on an LED structure comprising a PEDOT:PSS hole injecting layer, and aluminium cathode.

FIG. 6 shows an electroluminescence spectrum of polymer 12, as measured on an LED structure comprising a PEDOT:PSS hole injecting layer, and aluminium cathode.

The precursor 7 shown below comprising an asymmetric phenylene group has been prepared with surprising efficiency. This has been converted in to the "$C_8C_{10}$ polymer" that is a highly luminescent unsymmetrically substituted PPV derivative. The poly(2,5-bisdimethyldecylsilyl-1,4-phenylene vinylene) ("$C_{10}C_{10}$ polymer") has also been prepared

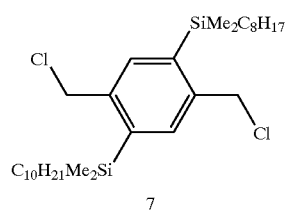

7

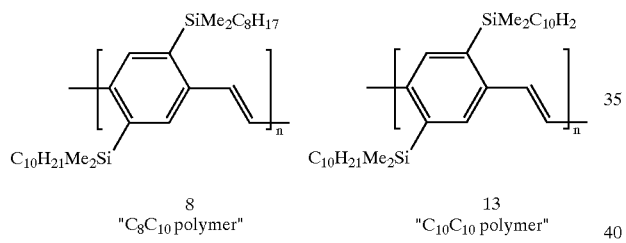

8
"$C_8C_{10}$ polymer"

13
"$C_{10}C_{10}$ polymer"

The above examples illustrate processes for the synthesis of poly(2-dimethyloctylsilyl-1,4-phenylene-vinylene) CDMOS-PPV polymer 6) and poly(2,5-bisdimethyloctylsilyl-1,4-phenylene)vinylene ($C_8C_8$ polymer 4) and the $C_{10}C_{10}$ polymer 13 as well as the unsymmetrical $C_8C_{10}$ polymer 8. These polymers exhibit a PL efficiency in the range 47–57% in the solid state and can be fabricated as the emissive layer in polymer LEDs in which ITO (on glass) and Al are the metal contacts.

The absorption spectra for $C_8C_{10}$ polymer 8, $C_{10}C_{10}$ polymer 13 and DMOS-PPV 6 are very similar (both the wavelength for peaks and the relative strength of the features). However, $C_8C_8$ polymer 3 shows a blue-shift of more than 8 nm with respect to the other spectra and has a much more pronounced UV feature as well.

Both EL and PL spectra for all four polymers are very similar, with the longest wavelength of the first peak in DMOS-PPV 6 and the shortest in $C_8C_{10}$ polymer 8. The vibronic structure is well resolved in both series of spectra and there is no indication of interference effects in microcavities that alter the spectra. PL efficiencies are reported.

The reaction scheme set out below further exemplifies the conversion step (vi).

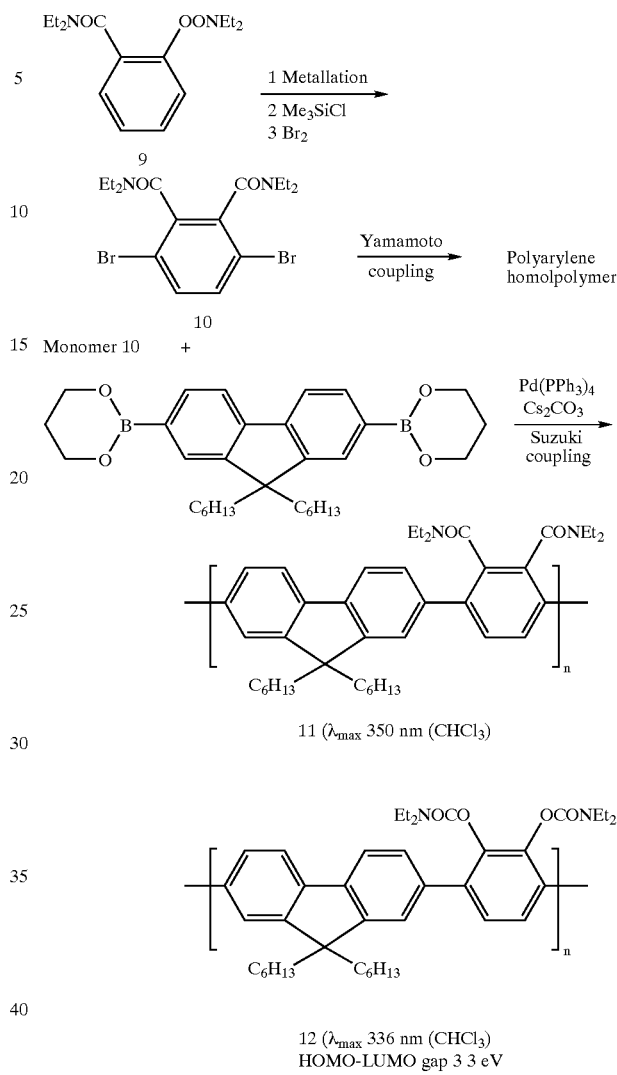

The Suzuki cross coupling of the monomer 10 and the related carbamate afford the blue emitting materials 11 and 12 respectively. Evidence of emission in the UV region of the spectrum is detected.

EXAMPLES

Example 1

Preparation of
2-Dimethyloctylsilyl-tetra-N-ethyl-terephthalamide

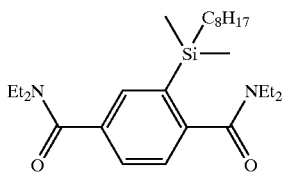

Tert-butyllithium (253 ml, 0.43 mmol) was added to tetra-N-ethyl-terephthalamide (100 mg, 0.36 mmol) in 30 ml of anhydrous tetrahydrofuran cooled with a bath of acetone-nitrogen. After 30', chlorodimethyloctylsilane (102 ml, 0.43 mmol) was added. The mixture was left to reach room temperature in its bath over three hours. Brine water was added and extracted with dichloromethane. The organic extract was dried with magnesium sulphate and concentrated in vacuo. Column chromatography using hexane/ethyl acetate (60/40) as an eluant (Rf=0.54; hexane/ethyl acetate (85/25)) gave a white solid(Yield: 78%). Mp 46° C.

Spectral Results

IR (KBr) in cm$^{-1}$: 2972, 2926, 2854, 1623, 1484, 1430, 1383, 1291, 1251, 1220, 1105, 1062, 842.

$^1$H-NMR $\delta_H$ (CDCl$_3$, 250 MHz) 7.40 (d, 1H, J=1.57 Hz), 7.22 (dd, 1H, J$_1$=7.75 Hz, J$_2$=1.57 Hz), 7.09 (d, 1H, J=7.75 Hz), 3.45–3.36 (m, 4H), 3.06–2.98 (m, 4H), 1.15–0.90 (m, 25H), 0.74–0.64 (m, 4H), 0.12 (s, 6H).

$^{13}$C-NMR $\delta_C$(CDCl$_3$, 62.5 MHz) 171.6, 171.0, 143.6, 137.4, 136.5, 132.8, 126.3, 125.6, 43.4, 38.9, 33.5, 31.8, 29.2, 29.1, 23.8, 22.5, 15.9, 14.0, 13.6, 12.7, –2.3.

Mass Spectrometry: (CI) m/z447.3400 (M$^+$) C$_{40}$H$_{80}$N$_2$O$_2$Si requires M 446.7400.

found C: 69.99%, H, 10.22%, N, 6.27%
calc.: C: 69.90%, H, 10.39%, N, 6.27%

Example 2

Preparation of 2-Dimethyloctylsilyl-5-dimethyldecylsilyl-tetra-N-ethyl-terephthalamide

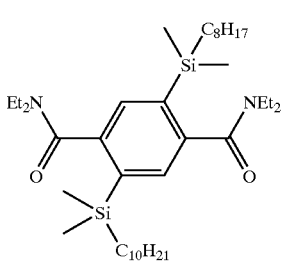

At –78° C., sec-butyllithium (2.9 ml, 3.7 mmol) was added to a solution of tetramethylethylenediamine (0.55 ml, 3.7 mmol) in 15 ml of dry tetrahydrofuran.2-dimethyloctyl-silyl-tetra-N-ethyl-terephthalamide (1.26 g, 2.8 mmol) in 15 ml of dry tetrahydrofuran was added drop wise and the mixture was stirred at –78° C. for 20'. After <addition of chlorodimethyloctylsilane (1 ml, 3.7 mmol), the reaction was left to reach room temperature in its bath overnight. Brine water was added and extracted with dichloromethane. The organic extract was dried with magnesium sulphate and concentrated in vacuo. Column chromatography using hexane/ethylacetate (80/20) as an eluant (Rf=0.41; hexane/ethyl acetate (80/20)) gave a white solid (Yield: 85%).

Spectral Results

IR (KBr) in cm$^{-1}$: 2955, 2922, 28.2, 1635, 1482, 1455, 1424, 1380, 1276, 1247, 1129, 1086, 868, 839, 813.

$^1$H-NMR $\delta_H$(CDCl$_3$, 250 MHz) 7.33 (s, 2H), 3.54 (q, 4H, J=7.15 Hz), 3.12 (q, 4H, J=7.15 Hz), 1.30–0.52 (m, 50H), 0.21 (s, 12H).

$^{13}$C-NMR $\delta_C$(CDCl$_3$, 62.5 MHz) 172.4, 142.2, 137.3, 132.2, 43.3, 38.9, 33.7, 31.9, 29.7, 29.4, 24.0, 22.7, 16.0, 14.1, 13.8, 12.8, –2.3.

Mass Spectrometry: (CI) m/z=644.5132.
Elemental analysis (645.17 for C$_{38}$H$_{72}$N$_2$O$_2$Si)
found C: 70.84%, H, 11.26%, N, 4.39%
calc.: C: 70.75%, H, 11.25%, N, 4.34%

Example 3

Preparation of 2-Dimethyloctylsilyl-5-dimethyldecylsilyl-tetra-N-ethyl-p-xylylenediamine

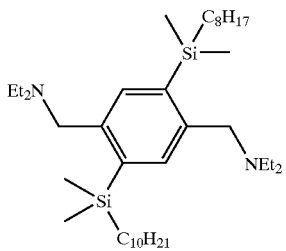

To a stirred solution of 2-dimethyloctylsilyl-5-dimethyl-decylsilyl-tetra-N-ethyl-terephthalamide (1.3 g, 2.3 mmol) in 30 ml of dry tetrahydrofuran was added borane-tetrahydrofuran complex (23 ml, 23 mmol). The reaction was refluxed for 18 h. Water was added carefully until the liberation of hydrogen stopped. The mixture was concentrated in vacuo and 6M hydrochloric acid was added. The aqueous solution was heated at reflux for 4 h. The solution was cooled and adjusted to pH 9 with sodium hydroxide. The aqueous phase was extracted with dichloromethane. The combined organic phases were dried with magnesium sulphate and concentrated in vacuo. Column chromatography using hexane/ethyl acetate (96/4) as an eluent (Rf=0.79; hexane/ethyl acetate (80/20)) gave a white solid (Yield: 52%). Mp=26° C.

Spectral Results

IR (CHCl$_3$) in cm$^{-1}$: 2963, 2922, 2852, 1466, 1370, 1248, 1203, 1166, 1121, 1057, 835.

$^1$H-NMR $\delta_H$(CDCl$_3$, 250 MHz) 7.71 (s, 2H), 3.63 (s, 4H), 2.51 (q, 5H, J=7.10 Hz), 1.30–0.81 (m, 50H), 0.30 (s, 12H).

$^{13}$C-NMR $\delta_C$ (CDCl$_3$, 62.5 MHz) 143.2, 137.821, 134.7, 58.6, 46.2, 33.7, 31.9, 29.7, 29.3, 24.2, 22.7, 16.6, 14.1, 11.7, 1.3.

Mass Spectrometry: (MALDI) m/z618.30 (MH)$^+$

Example 4

Preparation of 2-Dimethyldecylsilyl-5-dimethyldecylsilyl-1,4-bis(chloromethyl)benzene

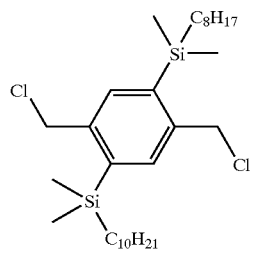

At 0° C., vinyl chloroformate (70.3 ml, 82.7 mmol) was added to 2-dimethyldecylsilyl-5-dimethyldecylsilyl-tetra-N-ethyl-p-xylylenediamine (663 mg, 1.09 mmol) in 20 ml of dry dichloromethane. The mixture was stirred at room temperature for 5 h. Brine water was added and the aqueous phase was extracted with dichloromethane. The combined organic phases were dried with magnesium sulphate and concentrated in vacuo. Column chromatography using hexane as an eluant (Rf=0.46; hexane) gave a white solid (Yield: 65%). MP=40° C.

Spectral Results

IR (CHCl$_3$) in cm$^{-1}$: 2923, 2854, 1466, 1411, 1377, 1344, 1254, 1192, 1172, 1140, 1108, 837, 792, 716.

$^1$H-NMR $\delta_H$ (CDCl$_3$, 250 MHz) 7.57 (s, 2H), 4.70 (s, 4H), 1.36–1.29 (m, 29H), 0.92–0.83 (m, 9H), 0.42 (s, 12H).

$^{13}$C-NMR $\delta_C$ (CDCl$_3$, 62.5 MHz) 141.9, 140.2, 137.0, 46.5, 33.6, 32.0, 29.7, 29.6, 29.4, 29.3, 24.0, 22.7, 16.5, 14.1, −1.5.

elemental analysis:
found C: 66.52%, H, 10.31%
calc.: C: 66.38%, H, 10.41%

Example 5

Preparation of Poly [2-(dimethyloctylsilyl)-5-(dimethyldecylsilyl)-1,4-phenylene vinylene]

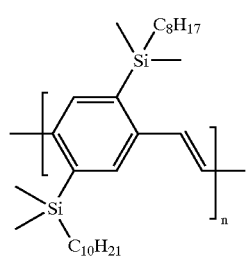

To a degassed solution of 2-dimethyldecylsilyl-5-dimethyldecylsilyl-1,4-bis(chloromethyl)benzene (109 mg, 0.2 mmol) in 15 ml of dry tetrahydrofuran was added a degassed solution of potassium-tert-butoxide (112.5 mg, 1 mmol) in 5 ml of dry tetrahydrofuran over 10'. The mixture was stirred under nitrogen overnight. The solution was poured into methanol to give bright yellow flaks. The polymer was reprecipitated in acetone and dried overnight. (Yield: 26%)

Spectral Results

UV (CHCl$_3$) $\delta_{max}$: 438 nm
UV (film) $\delta_{max}$: 430 nm
Mn (GPC) 289000; Mw (GPC) 1065000; PD=3.7
$^1$H-NMR (CDCl$_3$, 250 MHz) d/ppm vs.
TGA: decomposition at 350 $_i$C.
DSC: decomposition at 300 $_i$C. no Tg, no mp

Example 6

Device fabrication

Single and double layer devices featuring a hole conduction/electron blocking layer of PEDOT:PSS were prepared on ITO substrates with two different cathode metals (Al, Ca) Single and double layer devices were fabricated. Quantitative data is given only for double layer devices with a PEDOT:PSS layer.

Solvents for spin coating were either THF, and xylene or toluene. Tetrachloroethane was used for DMOS-PPV.

Table 1 Summary of devices made with a 40 nm PEDOT:PSShole conduction layer. All values are maximum values.

|  | PL | Alcd /m$^2$ | Ca cd/m$^2$ | Al cd/ A | Ca cd/A | turn-on voltages 0.1 cd/m$^2$ (0.01 cd/m$^2$) with Al | turn-on voltages 0.1 cd/m$^2$ (0.01 cd/m$^2$) with Ca |
|---|---|---|---|---|---|---|---|
| C$_8$C$_8$ 3 HR50 | 47% | 20 | 62 | 0.45 | 0.23 | 14 V (13 V) | 13 V (12 V) |
| DMOS-PPV6 FGB-17671 | 57% | 140 | 12 | 0.40 | 0.03 | 14 V | 13 V (12 V) |
| C$_8$C$_{10}$ 8 FGC-28139 | 57% | 260 | 36 | 0.23 | 0.05 | 8 V (7 V) | 6 V (5 V) |
| C$_{10}$C$_{10}$ 13 FGC-28138 | 53% | 31 | 113 | 0.16 | 0.20 | 12 V (10 V) | 7 V (6 V) |

Film thicknesses: 3:100 nm; 6: 90 nm; 8: 70 nm; 13: 120 nm

Various spectral results are shown in FIGS. 1 to 5. Other than for the C$_{10}$C$_{10}$ polymer 13 the best results were obtained using Al cathodes. The turn-on voltage using the C$_8$C$_{10}$ polymer 8 was lower than for the other materials (especially with Al cathodes). Thickness of the luminescent layer could be an important factor as well (the C$_8$C$_{10}$ polymer 8 and the C$_{10}$C$_{10}$ polymer 13 require the same field, which is lower than the one required for the C$_8$C$_8$ polymer 3 and DMOS-PPV 6).

The efficiency of the DMOS-PPV devices compares well with previous studies using this polymer. The highest efficiency in this study was measured using C$_8$C$_8$ polymer 3, while the highest luminescence was achieved using C$_8$C$_{10}$ polymer 8. This finding is in keeping with the surprising advantages in making a polymer having a first monomer comprising an asymmetric aromatic or heteroaromatic group in accordance with the present invention.

What is claimed is:

1. A method for making a polymer or oligomer comprising the steps of:
    (a) making a first monomer comprising a substituted aromatic or heteroaromatic group by:

(i) providing an aromatic or heteroaromatic group substituted with first and second director groups;
(ii) performing metalation by replacement of hydrogen at a first position on the aromatic or heteroaromatic group; and,
(iii) performing electrophilic substitution so as to provide a first substituent group at the first position; and
(b) contacting in a reaction mixture the first monomer with at least two further monomers that independently are the same or different from the first monomer under conditions so as to form a polymer or oligomer;
wherein the nature and positions of the first and second director groups regioselect the first position to be ortho to the first director group.

2. A method according to claim 1, wherein step (a) further comprises:
(iv) performing metalation at a second position on the aromatic or heteroaromatic group; and
(v) performing electrophilic substitution so as to provide a second substituent group at the second position;
wherein the nature and positions of the first and second director groups regioselect the second position.

3. A method according to claim 2, wherein the nature and positions of the first and second director groups regioselect the second position to be ortho to the second director group.

4. A method according to claim 2, wherein step (a) further comprises a step of independently converting at least one of the first director group, the second director group, the first substituent group, and the second substituent group into a reactive group to form a monomer having two reactive groups that participate in polymerisation.

5. A method according to claim 4, wherein the two reactive groups are para to one another.

6. A method according to claim 4, wherein each director group independently is converted to a phosphonate, a carbonyl, a triflate or a halomethyl group.

7. A method according to claim 6, wherein the polymer or oligomer comprises an arylene vinylene repeat unit that is derived from the first monomer.

8. A method according to claim 7, wherein the arylene vinylene unit comprises a phenylene vinylene group.

9. A method according to claim 4, wherein each substituent group independently is converted to a halide group.

10. A method according to claim 9, wherein the polymer or oligomer comprises a phenylene repeat unit that is derived from the first monomer.

11. A method according to claim 2, wherein at least one of the first and second substituent groups is independently selected from the group consisting of halide, $B(OH)_2$, $B(OR)_2$, organo stannane, alkoxy, alkoxyalkyl, alkyl, hydroxide, aryl, heteroaryl, silyl, triflate, amide, and $COCF_3$.

12. A method according to claim 11, wherein at least one of the first and second substituent groups is independently selected from the group consisting of Br, I, $SiMe_2C_8H_{17}$, $SiMe_2C_{10}H_{21}$, and $SiMe_3$.

13. A method according to claim 1, wherein the first substituent group is selected from the group consisting of halide, $B(OH)_2$, $B(OR)_2$, organo stannane, alkoxy, alkoxyalkyl, alkyl, hydroxide, aryl, heteroaryl, silyl, triflate, amide, and $COCF_3$.

14. A method according to claim 13, wherein the first substituent group is selected from the group consisting of Br, I, $SiMe_2C_8H_{17}$, $SiMe_2C_{10}H_{21}$, and $SiMe_3$.

15. A method according to claim 1, wherein metalation is performed by the addition of organo-lithium.

16. A method according to claim 1, wherein the first and second director groups are the same or different and independently are selected from alkoxy, alkoxyalkyl, amide, halide, haloalkyl, amino, aminoalkyl, carboxylic acid ester, urethane, carbamate, sulphonamide, sulphurylalkyl, and carbamide groups.

17. A method according to claim 16, wherein the first and second director groups are the same or different and independently are selected from the group consisting of $CONEt_2$, $CONHCMe_2Ph$, $OCONMeCMe_2Ph$, $OCONEt_2$, $SO_2NHCMe_2Ph$, and $SO_2$-tBu.

18. A method according to claim 1, wherein the first and second director groups are different.

19. A method according to claim 1, wherein the first and second director groups are the same.

20. A method according to claim 1, wherein the aromatic or heteroaromatic group is selected from phenylene, fluorene, anthracene and naphthalene groups.

* * * * *

UNITED STATES PATENT AND TRADEMARK OFFICE
CERTIFICATE OF CORRECTION

| | | |
|---|---|---|
| PATENT NO. | : 7,005,484 B1 | |
| APPLICATION NO. | : 10/048097 | |
| DATED | : February 28, 2006 | |
| INVENTOR(S) | : Andrew B. Holmes et al. | |

It is certified that error appears in the above-identified patent and that said Letters Patent is hereby corrected as shown below:

On the Title Page

At Field (75), Inventors, "Noyal Sur Vilaine" should be -- Servon Sur Vilaine --, At Field (75), Inventors, "Grenzach/Wyhlen (DE)" should be -- Basel (CH) --.

Signed and Sealed this

Twentieth Day of November, 2007

JON W. DUDAS
*Director of the United States Patent and Trademark Office*